United States Patent
Sekiya et al.

(10) Patent No.: US 6,603,307 B2
(45) Date of Patent: Aug. 5, 2003

(54) MAGNETIC FLUX DETECTOR WITH RESISTANCE OF ITS POTENTIAL SETUP RESISTOR SET LARGER THAN THAT OF ITS SEARCH COIL

(75) Inventors: Shigenobu Sekiya, Wako (JP); Yosuke Shionoya, Wako (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/084,922

(22) Filed: Mar. 1, 2002

(65) Prior Publication Data

US 2002/0163331 A1 Nov. 7, 2002

(30) Foreign Application Priority Data

Apr. 3, 2001 (JP) ........................................ 2001-104266

(51) Int. Cl.⁷ .......................... G01R 33/00; F16D 65/21
(52) U.S. Cl. .................. 324/225; 324/207.17; 324/239; 324/258; 73/862.69; 188/161; 361/146
(58) Field of Search ........................ 324/207.12, 207.17, 324/225, 239–243, 258; 192/84.1, 84.31; 188/161, 163, 164; 361/143–146, 159, 160; 73/862.626, 862.69

(56) References Cited

U.S. PATENT DOCUMENTS

| | | | | |
|---|---|---|---|---|
| 3,750,010 A | * | 7/1973 | Abnett et al. | 324/243 |
| 4,680,657 A | * | 7/1987 | Naito | 360/111 |
| 5,510,707 A | * | 4/1996 | Caron | 324/166 |
| 6,121,769 A | * | 9/2000 | Mukai et al. | 324/207.12 X |
| 6,208,497 B1 | * | 3/2001 | Seale et al. | 361/160 |

FOREIGN PATENT DOCUMENTS

JP 4-312217 11/1992

* cited by examiner

*Primary Examiner*—Gerard R. Strecker
(74) *Attorney, Agent, or Firm*—Armstrong, Westerman & Hattori, LLP

(57) ABSTRACT

A magnetic flux detector comprises a core member 12 and an armature member 11, and the core member 12 generates a magnetic flux by an exciting coil 13 when the exciting coil receives an excitation current controlled by an excitation current controller 30. The magnetic flux detector further comprises a search coil 14, which is provided in a magnetic path for the magnetic flux, and a magnetic flux calculator 40, which determines the magnitude of the magnetic flux by measuring an electromotive force induced in the search coil 14 by a change in the magnetic flux. The magnetic flux calculator 40 has a potential setup resistor 43, whose resistance B is sufficiently larger than the internal resistance A of the search coil 14 (approximately A=B/3~B/30).

7 Claims, 7 Drawing Sheets

MAGNETIC FLUX DETECTOR WITH RESISTANCE OF ITS POTENTIAL SETUP RESISTOR SET LARGER THAN THAT OF ITS SEARCH COIL

FIELD OF THE INVENTION

The present invention relates to a magnetic flux detector which is placed in lines of magnetic flux to detect the magnetic flux.

BACKGROUND OF THE INVENTION

Electromagnetic devices whose solenoids are supplied with excitation currents to generate magnetic fluxes are well known, and electromagnetic clutches, which utilize electromagnetic forces generated by such electromagnetic devices for engaging the clutch discs, are also well known. For example, Japanese Laid-Open Patent Publication No. H04 (1992)-312217 discloses an arrangement in which a differential limiter that is activated by the engagement of a main clutch is provided to the rear differential gears of an automobile, the main clutch being operated by a pilot clutch which comprises an electromagnetic clutch. In this arrangement, the duty value for the excitation current supplied to the solenoid of the electromagnetic clutch is controlled in feedback of the engaging force (clutching force) of the electromagnetic clutch, which force is being detected. The detection of the engaging force of the clutch for this feedback control is performed by detecting a leakage flux of the main magnetic flux, which is being generated by the solenoid, with a magnetic flux density sensor comprising a Hall element.

In such an arrangement, as a leakage flux from the main magnetic flux is determined in magnetic flux density by a Hall element, in the assemblage, a little misalignment of the magnetic flux density sensor, which comprises a Hall element, affects the accuracy of the detection. This is a problem that affects accuracy in detecting the magnetic flux. In addition, if an attempt to improve the efficiency of the magnetic circuit is attempted, then such an attempt will cause a reduction in the magnitude of the leakage flux and thus will also lead to a reduction in the accuracy of the detection. In other words, although the efficiency of the magnetic circuit is improved when the leakage flux is reduced, the reducing of the leakage flux can reduce the accuracy of the magnetic flux detection.

To solve such problems, the applicant of the present invention has designed a magnetic flux detector which comprises a search coil. This search coil is provided in a path where lines of magnetic flux will pass when a magnetic flux is generated. The detector is used to measure the electromotive-force induced in the search coil by the changing magnetic flux and to integrate the electromotive force for a time period for detection of the magnetic flux. Because the search coil can detect the main magnetic flux, which passes through the path where the search coil is positioned (such a path is hereinafter referred to as a magnetic path), use of this magnetic flux detector solves the above mentioned problem of the prior-art magnetic flux detector that comprises a Hall element.

However, for a device that generates an electromagnetic force, for example, a clutch mechanism, this magnetic path, where the search coil is placed, is located inside the mechanism, so the search coil is exposed to a harsh environment which is created and affected by the operational condition of the clutch. As the ambient temperature to which the search coil is exposed changes over a time, the operational temperature of the search coil also changes appreciably, causing the internal resistance of the coil to change accordingly. If there is a change in the internal resistance, then there will be a corresponding difference in the electromotive force induced in the coil even though the magnetic flux itself experiences no change. This is another problem that prevents accurate magnetic flux detection.

SUMMARY OF THE INVENTION

It is an object of this invention to provide a magnetic flux detector which comprises a search coil provided in a magnetic path where a main magnetic flux exists. Such a detector enables a direct and highly accurate detection of the magnetic flux even though a leakage flux is minimized.

Another object of this invention is to provide a magnetic flux detector which performs a highly accurate magnetic flux detection even if the internal resistance of the search coil changes in response to fluctuations in the operational temperature of the search coil.

A magnetic flux detector according to the present invention comprises a magnetic flux generator (for example, the exciting coil 13 and the armature member 11 described in the following embodiment), a search coil, which is placed in a magnetic path where a magnetic flux generated by the magnetic flux generator passes, and a magnetic flux calculator, which has a potential setup resistor whose resistance is larger than the internal resistance of the search coil. The magnetic flux generator generates a magnetic flux, and an electromotive force is induced in the search coil in response to a change in the magnetic flux. The magnetic flux calculator determines the magnitude of the magnetic flux being generated by the magnetic flux generator by measuring the electromotive force induced in the search coil.

In the magnetic flux detector, the search coil is placed in the magnetic path of the magnetic flux (so-called main magnetic flux) generated by the magnetic flux generator. Because of this arrangement, an electromotive force is induced in the search coil when there is a change in the magnetic flux. When this electromotive force is integrated for a time period, the magnetic flux that is passing through the magnetic path is determinable accurately. This arrangement effectively eliminates a problem or errors which may otherwise occur if the sensor is misaligned as in a case of prior art where the sensor comprises a Hall element to detect a leakage flux for calculation of the magnetic flux. Also, this arrangement secures the accuracy of the magnetic flux detector because it is immune to a flux leakage reduction, which can result from an improvement in the efficiency of the magnetic circuit.

In addition, the magnetic flux detector according to the present invention comprises a potential setup resistor whose resistance is larger than the internal resistance of the search coil. This resistor is placed at the inlet of the magnetic flux calculator. This arrangement effectively minimizes the effect of fluctuations in the internal resistance of the search coil on the electromotive force induced in the search coil. The reason is that the magnitude of such an influence corresponds to the ratio of the internal resistance of the search coil to the resistance of the potential setup resistor. As the fluctuation of the electromotive force induced in the search coil is minimized against fluctuations in the internal resistance of the search coil, the precision of the detector is maintained to perform an accurate magnetic flux detection even while the internal resistance of the search coil is changing in response to the fluctuation of the temperature.

The magnetic flux calculator of the magnetic flux detector according to the present invention may comprise a high potential setup circuit, which is connected to one end of the search coil and supplies a predetermined high voltage, a low potential setup circuit, which is connected through the potential setup resistor to the other end of the search coil and supplies a predetermined low voltage, and an electrical potential measuring device, which is connected to a predetermined point between the potential setup resistor and the latter end of the search coil and measures the electrical potential at this predetermined point. In this arrangement, while the high voltage set by the high potential setup circuit and the low voltage set by the low potential setup circuit are constant, if the internal resistance of the search coil fluctuates, then the voltage measured at the predetermined point by the electrical potential measuring device is affected from the fluctuation only to a degree which corresponds to the ratio of the internal resistance of the search coil to the resistance of the potential setup resistor. Because this ratio is made comparatively small by setting the resistance of the potential setup resistor substantially larger than the internal resistance of the search coil, the error in the measurement of the electromotive force induced is minimized against changes in the internal resistance of the search coil.

It is preferable that the magnetic flux calculator be constructed to provide the high voltage, which is supplied by the high potential setup circuit, and the low voltage, which is supplied by the low potential setup circuit, in positive values. Then, the electrical potential measuring device will measure only positive values. In this case, the circuit arrangement of the measuring device can be simplified for cost-effectiveness.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings, which are given by way of illustration only and thus are not limitative of the present invention.

DESCRIPTION OF THE PREFERRED EMBODIMENTS

Figure 1:
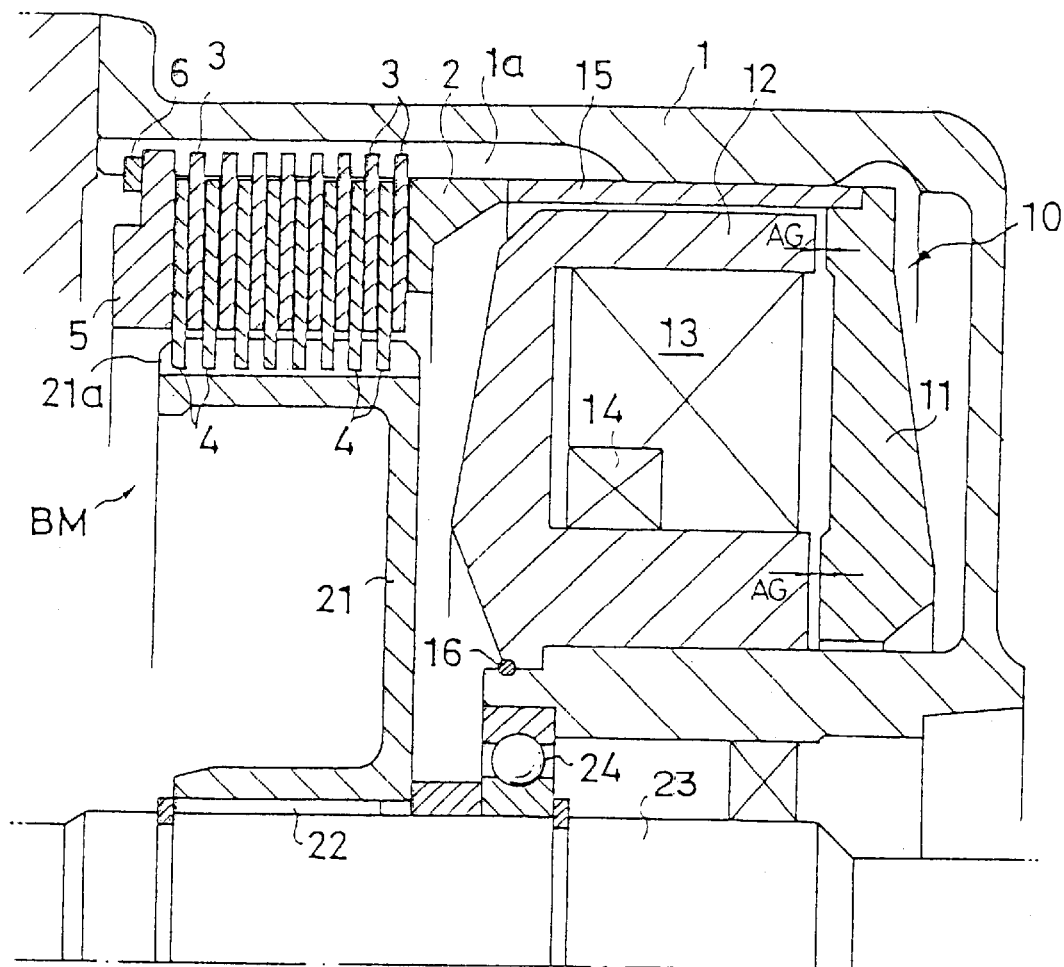
FIG. 1 is a cross-sectional view of an electromagnetic brake which comprises a magnetic flux detector according to the present invention.

Now, preferred embodiments of magnetic flux detector according to the present invention are described in reference to the drawings. FIG. 1 shows an electromagnetic brake which comprises a magnetic flux detector according to the present invention. This electromagnetic brake comprises, in a fixed and stationary cylindrical brake housing 1, a multiple disk brake mechanism BM and an electromagnetic presser mechanism 10, which generates and provides a brake engaging force for the multiple disk brake mechanism BM. The electromagnetic brake slows or stops the rotation of a rotating shaft 23, which is provided centrally through the brake housing 1 and supported on ball bearings 24, rotatably with respect to the brake housing 1. For effective braking operation, the rotating shaft 23 is provided with a brake hub 21, which is mounted thereon through splines.

The multiple disk brake mechanism BM includes a plurality of separator plates 3 and a plurality of friction plates 4 in the brake housing 1. The peripheral portions of the separator plates 3 are engaged to inner splines 1a which are provided in the inner peripheral wall of the brake housing 1. With this arrangement, the separator plates 3 are movable axially, but its rotation is restricted. On the other hand, each of the friction plates 4 is composed of a metallic disk and facings, which are laminated on both the sides of the disk, and each friction plate 4 is positioned between the successive separator plates 3. In other words, the separator plates 3 and the friction plates 4 are alternately placed one after another in the axial direction. The inner portions of the friction plates 4 are engaged to outer splines 21a which are provided on the outer peripheral wall of the brake hub 21, so the friction plates 4 are movable axially and rotate with the rotating shaft 23 in unison.

On the left side of the separator plates 3 and friction plates 4, which are arranged in the brake housing 1 as described above, an end plate 5 is provided with a retaining ring 6, which restricts the leftward movement of the end plate 5 in the axial direction. On the other hand, a pressure plate 2 is provided on the right side of the separator plates 3 and friction plates 4. In this arrangement, when the pressure plate 2 is pushed leftward to press the separator plates 3 and friction plates 4 onto the end plate 5, a friction is generated between the sides of the separator plates 3 and the facings of the friction plates 4 to bring the rotational speed of the friction plates 4 to that of the separator plates 3 as a braking action. In other words, the separator plates 3 are rotationally fixed to the brake housing 1 through splines while the friction plates 4 are rotationally connected to the brake hub 21 also through splines to rotate with the rotating shaft 23 like a one-piece body as described above. When the pressure plate 2 is pushed leftward, the rotation of the friction plates 4, i.e., the rotation of the rotating shaft 23 is damped.

It is the function of the electromagnetic presser mechanism 10 to achieve the leftward movement of the pressure plate 2. The electromagnetic presser mechanism 10, which is placed in the brake housing 1, has a ring figure with a horizontally laid U-shaped cross section and comprises a core or yoke member (hereinafter referred to as "core member") 12, a ring-like exciting coil 13, a ring-like search coil 14, a disk-like armature member 11 and a cylindrical pressing member 15. The core member 12 is fixed by a retaining ring 16 in the brake housing 1, and the exciting coil 13 and the search coil 14 are provided adjacent to each other, and are fixed in the groove of the core member 12, which groove is defined by the horizontally laid U-shaped cross section. The armature member 11 is provided opposite to the opening of the groove of the core member 12, and the pressing member 15 is connected to the outer periphery of the armature member 11. In this construction, the armature member 11 together with the pressing member 15 is movable axially in the brake housing 1 to bring the left end face of the pressing member 15 into contact with the right end face of the pressure plate 2. Alternatively, the pressure plate 2 and the pressing member 15 can be formed in a one-piece body.

Figure 2:
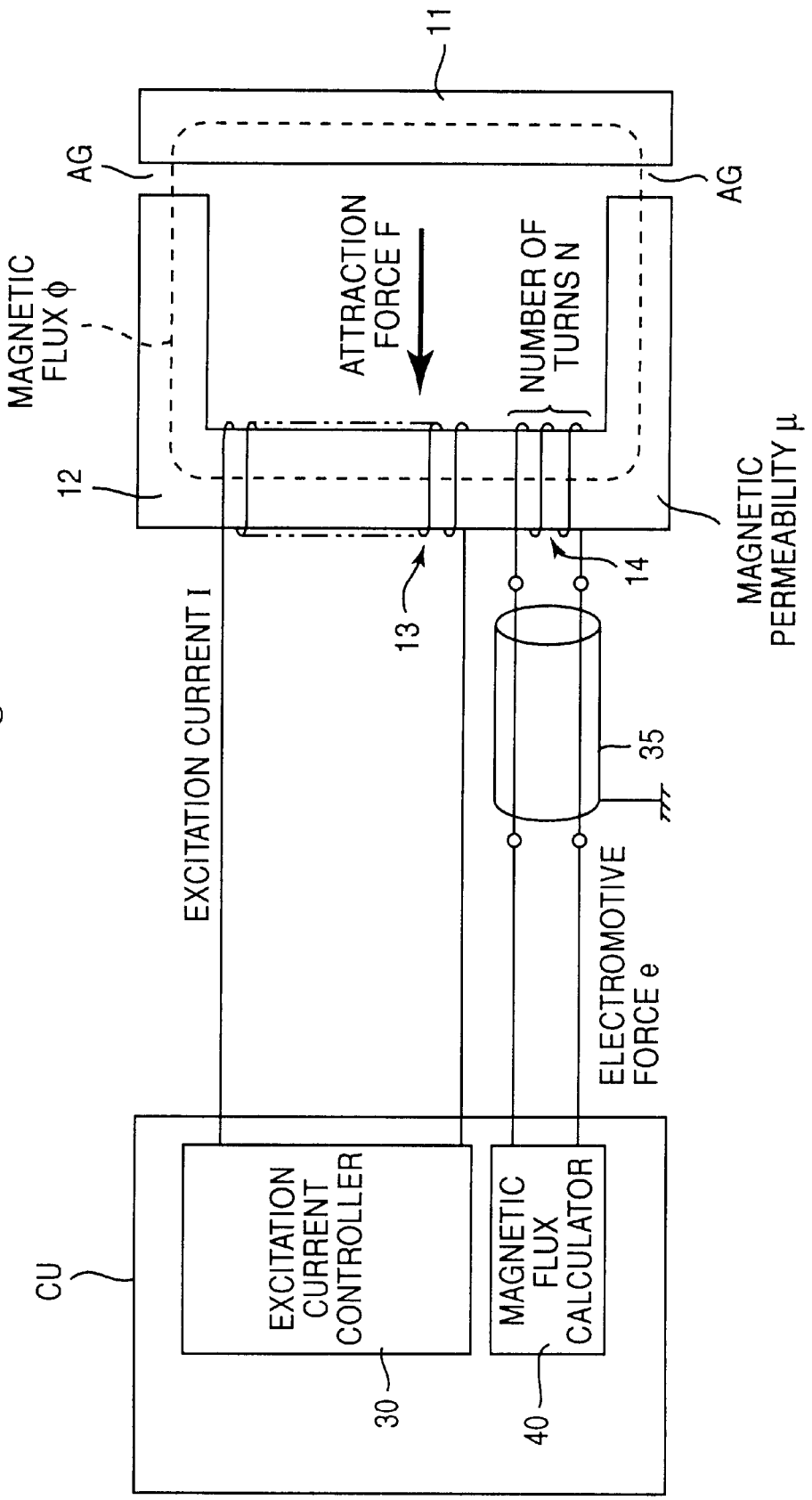
FIG. 2 is a schematic diagram of an electromagnetic presser mechanism that constitutes the electromagnetic brake.

FIG. 2 is a schematic diagram to illustrate the operation of the electromagnetic presser mechanism 10. When an excitation current I is supplied from an excitation current controller 30 provided in a control unit CU to the exciting coil 13, a magnetic flux φ (shown in broken line) is generated through the core member 12 and the armature member 11 with a force F attracting the armature member 11 to the core member 12. When the attraction force F acts on the armature member 11, the armature member 11 together with the pressing member 15 is shifted leftward in the drawing of FIG. 1, with the left end face of the pressing member 15 meeting the right end face of the pressure plate 2. As a result, the pressure plate 2 is pushed leftward, pressing the separator plates 3 and the friction plates 4 onto the end plate 5 and thereby braking the rotation of the rotating shaft 23.

This braking force corresponds to the attraction force F acting on the armature member 11. Therefore, by controlling the excitation current I, which is supplied from the excitation current controller 30 of the control unit CU to the exciting coil 13, the braking operation of the rotating shaft 23 is controllable. To convey the attraction force F acting on the armature member 11 directly to the pressure plate 2, a clearance (hereinafter referred to as "air gap AG") is provided between the right end face of the core member 12 and the left end face of the armature member 11 even while the pressing member 15 is in contact with the pressure plate 2. As the air gap AG becomes smaller as the facings of the friction plates 4 wear away, it is necessary to adjust the supply control of the excitation current I in correspondence to the change of the air gap AG, so that the attraction force F will be always set to a desirable level. For this purpose, the search coil 14 should always detect accurately the magnetic flux φ, which changes correspondingly to the change of the air gap AG. The following is a description of the magnetic flux detection performed by the search coil 14.

When the excitation current I is supplied to the exciting coil 13 to generate a magnetic flux φ, an electromotive force e is induced in the search coil 14 correspondingly to the rate of change of the magnetic flux φ (dφ/dt). To detect the electromotive force e being generated in the search coil 14, the search coil 14 is connected through a shielded cable 35 to a magnetic flux calculator 40 provided in the control unit CPU as shown in FIG. 2. (The magnetic flux calculator 40 has an inlet 49 for connection to the search coil 14 through the shielded cable 35.) The magnetic flux calculator 40 detects the electromotive force e being induced in the search coil 14 and calculates the magnitude of the magnetic flux φ based on the detected value of the electromotive force e.

Figure 3:
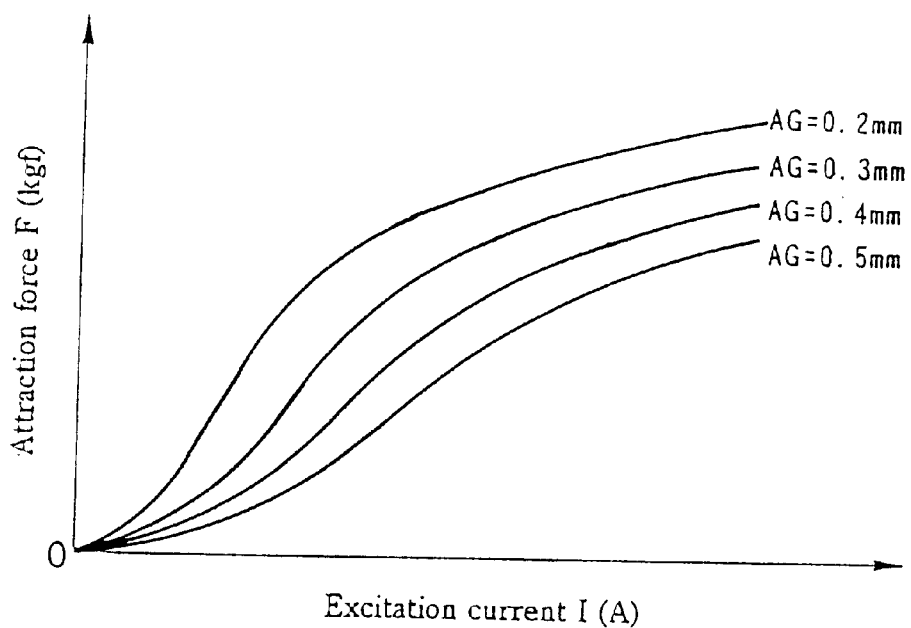
FIG. 3 is a graph showing a relation between excitation current I and the attraction force F of the electromagnetic presser mechanism.

To illustrate this calculation of the magnetic flux φ, at first, relations among the excitation current I, the attraction force F, the magnetic flux (effective magnetic flux) φ and the air gap AG are described. FIG. 3 shows the characteristics of the attraction force F observed for the change of the excitation current I when the air gap AG is set to 0.2 mm, 0.3 mm, 0.4 mm and 0.5 mm, respectively, in the electromagnetic brake shown in FIG. 1. It is clear from the graph that the attraction force F increases as the excitation current I increases as long as the air gap AG is kept constant. On the other hand, if the excitation current I is kept constant, the attraction force F becomes smaller as the air gap AG increases.

Figure 4:
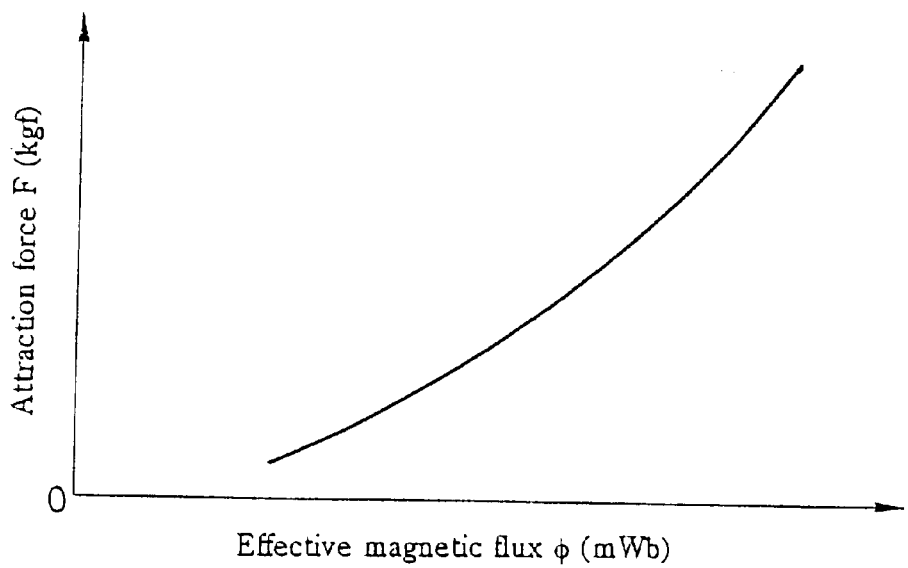
FIG. 4 is a graph showing a relation between the effective magnetic flux $\phi$ and the attraction force F of the electromagnetic presser mechanism.

However, the relation between the attraction force F and the effective magnetic flux φ generated by the exciting coil 13 is not affected by the change of the air gap AG, and the attraction force F increases as the effective magnetic flux φ increases as shown in FIG. 4. Therefore, the relations described in FIGS. 3 and 4 must be considered together to determine the size or change of the air gap AG from the excitation current I and the magnetic flux φ being detected. On the basis of the air gap AG thus determined, the excitation current I supplied to the exciting coil 13 can be controlled in a precise manner. Furthermore, by knowing the effective magnetic flux φ in the relation shown in FIG. 4, the attraction force F acting on the armature member 11, i.e., the braking force, can be determined.

For this purpose, the magnetic flux calculator 40 calculates the magnitude of the effective magnetic flux φ from the electromotive force e induced in the search coil 14. The calculation is possible because there is a relation among the electromotive force e, the number of turns N of the search coil 14 and the rate of chronological change dφ/dt of the magnetic flux φ generated by the exciting coil 13 as described in the following equation (1) (Faraday's law).

$$e = N(d\phi/dt) \tag{1}$$

The magnetic flux φ can be calculated by integrating the rate of chronological change dφ/dt over a time period, so the magnetic flux calculator 40 calculates the magnetic flux φ by using the following equation (2), which is a variation of the above equation (1).

$$\phi = (1/N) \int e \, dt + C \tag{2}$$

Here, C is a constant of integration, and it is reset every time when the excitation current I is supplied to the exciting coil 13.

As described above, the magnetic flux detection performed by the magnetic flux calculator 40 does not use a prior-art magnetic flux density sensor, which includes a Hall element, but utilizes the search coil 14, which is provided in the magnetic flux φ to detect the electromotive force e induced in therein. As a result, the present invention can provide a more accurate magnetic flux detector. After the magnetic flux φ is determined, the attraction force F acting on the armature member 11 (the pressing force acting on the multiple disk brake mechanism BM) can be calculated from the following equation (3), which uses the relations of the magnetic permeability $\mu$ and the cross-sectional area S of the air gap between the armature member 11 and the core member 12.

$$F=\phi^2/(2\,\mu S) \qquad (3)$$

Figure 5A:
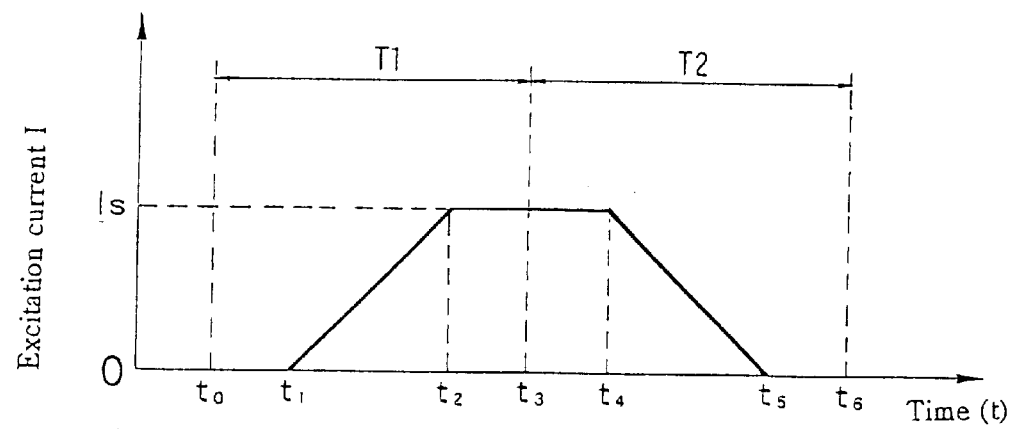
FIGS. 5A, 5B and 5C are graphs showing, respectively, a pattern of chronological change observed in the excitation current I supplied to the electromagnetic presser mechanism, a pattern of chronological change in the electromotive force e induced in the search coil with no drift electromotive force, and a pattern of chronological change in the electromotive force e induced in the search coil with a presence of drift electromotive force.

As described above, the magnetic flux $\phi$ is calculated by integrating the electromotive force e being induced in the search coil 14 (refer to the above equation (2)). However, the electromotive force e itself changes in response to the pattern of how the excitation current I is applied. Therefore, the present invention applies the excitation current I in the pattern shown in FIG. 5A for the determination of the magnitude of the magnetic flux $\phi$ and the size or change of the air gap AG. As shown in FIG. 5A, the excitation current increases from zero to a predetermined current value Is during a first predetermined time period T1 from time t0 to t3, and then, it decreases from the predetermined current value Is to zero during a second predetermined time period T2 from time t3 to t6.

Figure 5B:
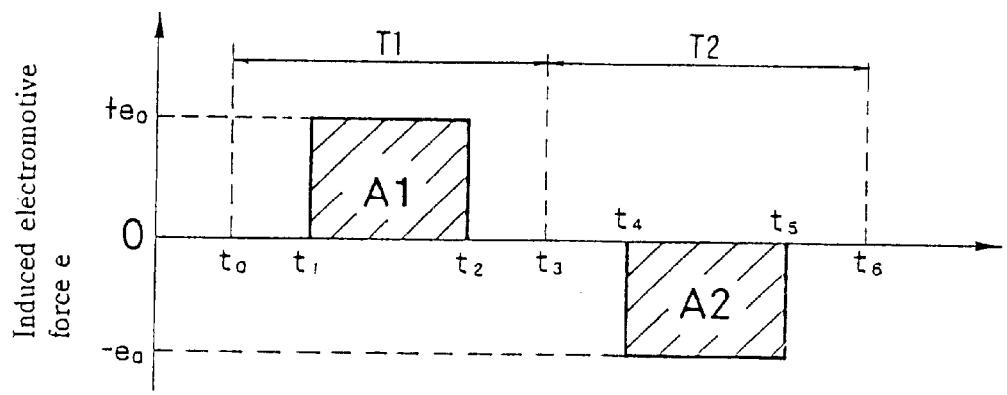

With the excitation current I being applied to the exciting coil 13 in the pattern shown in FIG. 5A, a positive electromotive force +e0 is induced while the excitation current is being increased (period from time t1 to t2) on one hand, and a negative electromotive force −e0 is induced while the excitation current is being reduced (period from time t4 to t5) on the other hand. In this example, the rate of increase and the rate of decrease of the excitation current are set constant and equal to each other in absolute value, so both the electromotive forces +e0 and −e0 have the same constant absolute value as shown in FIG. 5B.

If the excitation current I is applied to the exciting coil 13 in accordance with the above described pattern, then the magnetic flux $\phi$ generated while the predetermined current value Is is maintained for the excitation current I (period from time t2 to t4) can be calculated as the integral of the electromotive force e induced while the excitation current I is increased from zero to the predetermined current value Is (integral of the electromotive force induced during the first predetermined time period T1) and also as the integral of the electromotive force e induced while the excitation current I is decreased from the predetermined current value Is to zero (integral of the electromotive force induced during the second predetermined time period T2) as described in the above equation (2). Therefore, the area A1 defined by the magnitude of the electromotive force e and the time period between time t1 and t2 for the electromotive force e induced for the time period between time t0 and t3 in FIG. 5B corresponds to the magnetic flux $\phi$ generated by the excitation current I applied at the predetermined current value Is. Also, the area A2 defined by the magnitude of the electromotive force e and the time period between time t4 and t5 for the electromotive force e induced for the time period between time t3 and t6 in FIG. 5B corresponds to the magnetic flux $\phi$ generated by the excitation current I applied at the predetermined current value Is. Theoretically, the calculation of either area A1 or area A2 gives a determination of the magnitude of the magnetic flux $\phi$.

Figure 5C:
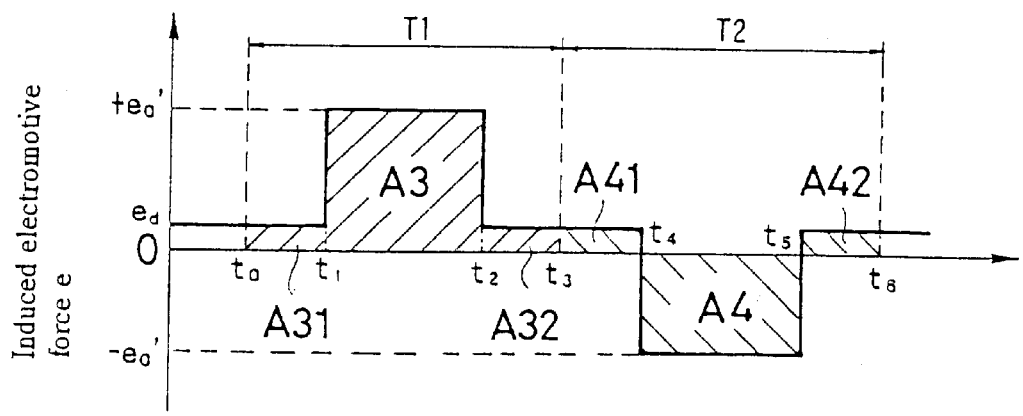

In reality, a so-called drift electromotive force ed, i.e., an error electromotive force, is often observed while the excitation current I is kept at zero as shown in FIG. 5C. If an integration is executed for the electromotive force e induced during the first predetermined time period T1 (or during the second predetermined time period T2) in such a condition, then the calculated value for the magnetic flux $\phi$ will include an error which corresponds to the drift electromotive force ed, making the magnetic flux detection inaccurate. To solve this problem, the magnetic flux calculator 40 calculates the magnetic flux $\phi$ by subtracting the integral of the electromotive force for the second predetermined time period T2 (hereinafter referred to as "decreasing electromotive force integral") from the integral of the electromotive force for the first predetermined time period T1 (hereinafter referred to as "increasing electromotive force integral") and by halving the value achieved from the subtraction.

It is clear from FIG. 5C that the drift electromotive force ed is always constant. Therefore, as long as the first predetermined time period T1 and the second predetermined time period T2 have the same value, i.e., T1=T2, the drift electromotive force ed can be canceled out just by subtracting the reducing electromotive force integral from the increasing electromotive force integral to calculate the magnetic flux $\phi$ accurately without the effect of the drift electromotive force ed. In other words, the total area of areas A41 and A42 in FIG. 5C is subtracted from the total area of areas A31 and A32, with a resultant difference of zero, so the magnetic flux $\phi$ is calculated from the average of areas A3 and A4, which correspond respectively to the electromotive forces actually induced by the change of the excitation current. In this way, the present invention enables accurate detection of the magnetic flux $\phi$ without any effect of drift electromotive force ed. In a case where there is no drift electromotive force as shown in FIG. 5B, the total area of area A1 and A2 is calculated by subtracting area A2 (negative value) from area A1 positive value), and then the total area is divided by 2 to achieve an average area. In this case, the present invention also enables accurate detection of the magnetic flux $\phi$.

In the case shown in FIG. 5A, the rate of increase and the rate of decrease of the excitation current have the same absolute value, so also the positive electromotive force +e0 induced while the excitation current is being increased and the negative electromotive force −e0 induced while the excitation current is being reduced have the same absolute value. Although the rate of increase and the rate of decrease of the excitation current can be set different, it is preferable that both the rates be set to the same absolute value to minimize the error in the magnetic flux detection.

In the above described determination of the magnitude of the magnetic flux $\phi$, the electromotive force e is a positive value for the increasing excitation current while it is a negative value for the decreasing excitation current. Therefore, the magnetic flux calculator 40 needs a circuit to detect both positive and negative electromotive forces. This requirement can complicate the construction of the magnetic flux calculator 40. However, the magnetic flux calculator 40 can be designed as shown in FIG. 6, so that the electromotive force e can be induced always in positive values.

Figure 6:
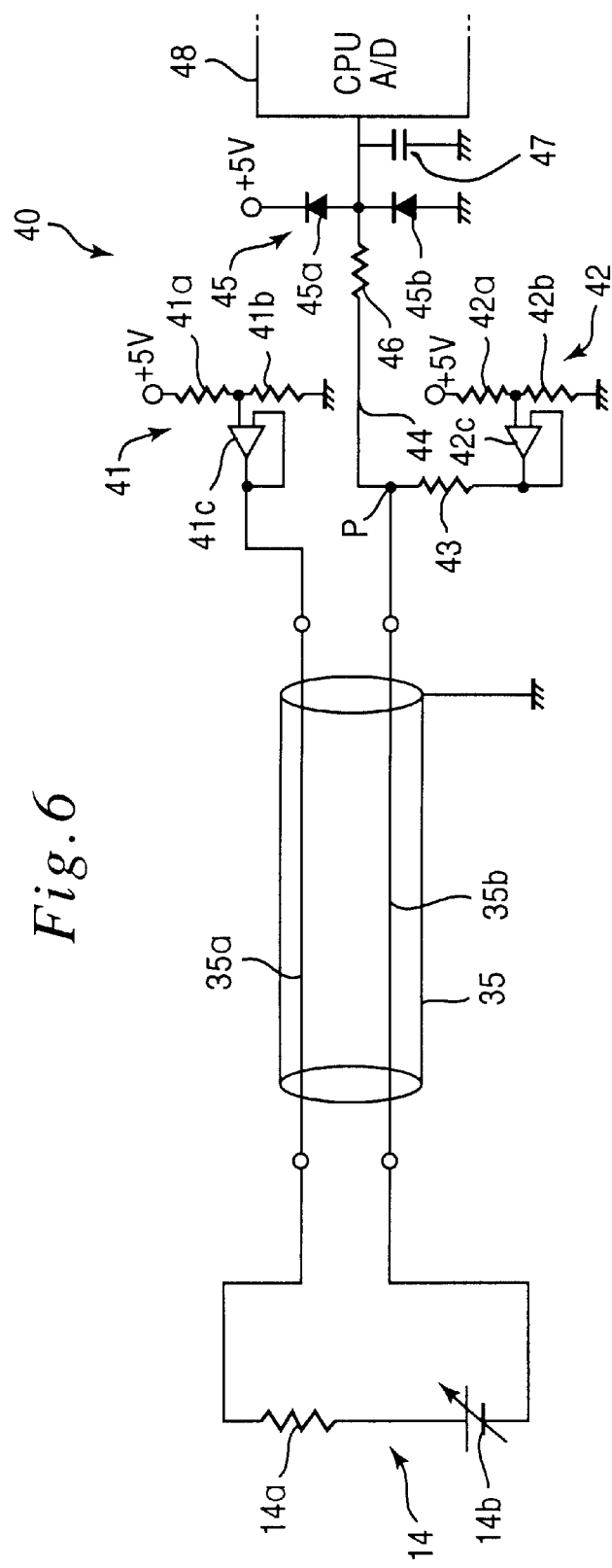
FIG. 6 is an electrical circuit diagram describing a magnetic flux calculator, which generates an offset electromotive force.

The magnetic flux calculator 40 shown in FIG. 6 comprises a high potential setup circuit 41, a low potential setup circuit 42, a potential setup resistor 43, an electromotive force measurement line 44, a protection circuit 45 and a CPU 48. In the high potential setup circuit 41, a power supply of +5 V is connected to two resistors 41a and 41b in series having the same resistance. A high electrical potential VH of +2.5 V drawn through an operational amplifier 41c from a point between the two resistors is led through line 35a of the shielded cable 35 and applied to the search coil 14. In FIG. 6, the resistance of the search coil 14 is indicated by number "14a" while the electromotive force inducing function thereof is indicated by number "14b". On the other hand, in the low potential setup circuit 42, a power supply of +5 V is connected to two resistors 42a and 42b in series having different resistances (the resistance of resistor 42a is larger), and a low electrical potential VL of +0.5 V is drawn through an operational amplifier 42c from a point between these two resistors.

The output of the operational amplifier 42c is led through the potential setup resistor 43 and then through line 35b of the shielded cable 35 and applied to the search coil 14. In addition, to a point between the potential setup resistor 43 and line 35b, the electromotive force measurement line 44 is connected to measure the electrical potential at the point P. The electromotive force measurement line 44 is connected through the protection circuit 45 to the CPU 48. The voltage measured at that point P is passed through analog-digital conversion and taken into the CPU 48, and the measurement data are processed in the CPU to calculate the magnitude of the magnetic flux φ by integration over a time period.

The protection circuit 45 protects the CPU 48 by preventing the voltage of the measurement line 44 from increasing abnormally above a permissible range (for example, 0.3 V~5.3 V). In the example shown in FIG. 6, the protection circuit 45 includes a diode 45a connected between the 5V power supply and measurement line 44, through a resistor 46. The protection circuit 45 also includes a diode 45b connected in parallel with a capacitor 47 between measurement line 44 (through resistor 46) and ground.

In this example, the potential setup resistor 43 has a resistance B (for example, B=1 kΩ) which is sufficiently larger than the resistance A (A=100 Ω) of the search coil 14. Therefore, when the electromotive force e induced in the search coil 14 is nil, the voltage VP at that point P is the voltage (VH=2.5 V) which is set by the high potential setup circuit 41. More precisely, this predetermined voltage VP can be defined by the following equation (4). This voltage is applied to the point P as an offset electromotive force. This means that the electromotive force detected by the CPU 48 always includes this offset value. In other words, the CPU 48 detects the voltage which is the sum of the offset electromotive force and the electromotive force e actually induced in the search coil 14.

$$VP = (VH - VL) \times \{B/(A + B)\} + VL \quad (4)$$
$$= (2.5 - 0.5) \times (1000/1100) + 0.5$$
$$= 2.31$$

Figure 7A:
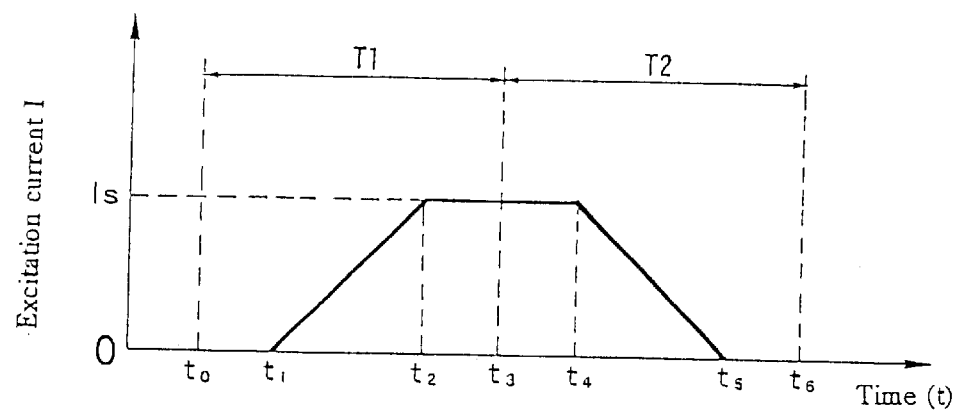
FIGS. 7A and 7B are graphs showing, respectively, a pattern of chronological change observed in the excitation current I supplied to the electromagnetic presser mechanism and a pattern of chronological change in the electromotive force e detected by the magnetic flux calculator shown in FIG. 6.
Figure 7B:
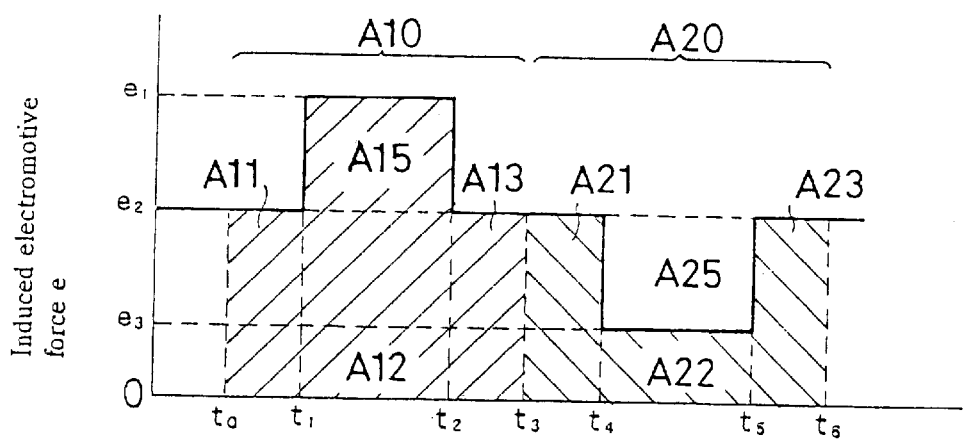

In this magnetic flux calculator 40, when the excitation current is applied to the exciting coil 13 in the pattern shown in FIG. 7A (this pattern is identical with that shown in FIG. 5A), the electromotive force e detected by the CPU 48 appears as shown in FIG. 7B because it includes the offset electromotive force e2 (=VP). In the time period from time t1 to t2, an electromotive force e1 is detected, and the detected value includes a positive electromotive force induced in the search coil 14 (i.e., from the electromotive force inducing function 14b). In the time period from time t4 to t5, an electromotive force e3 is detected, and the detected value includes a negative electromotive force induced in the search coil 14 (i.e., from the electromotive force inducing function 14b). In this case, also, the magnetic flux φ is determined by subtracting the decreasing electromotive force integral, i.e., the integral of the electromotive force e for the second predetermined time period T2, from the increasing electromotive force integral, i.e., the integral of the electromotive force e for the first predetermined time period T1, and by halving the value achieved from this subtraction.

By subtracting the reducing electromotive force integral from the increasing electromotive force integral, the effect of the offset electromotive force e2 is canceled out in the determination of the magnitude of the magnetic flux φ, making the determination accurate. More specifically, in FIG. 7B, the total area of areas A21 and A23 hatched in the drawing is subtracted from the total area of areas A11 and A13 also hatched, with a resultant difference of zero. Then, the area A22 for the time period between time t4 and t5 is subtracted from the area A12 for the time period between time t1 and t2 to calculate, as an integral value, the sum of the area A15 which corresponds to the integral of the positive electromotive force actually induced in the search coil 14 and the area A25 which corresponds to the integral of the negative electromotive force actually induced in the search coil 14. Then, this integral value is halved (for an average) to determine the magnitude of the magnetic flux φ accurately.

The search coil 14 of the magnetic flux detector constructed as shown in FIG. 6 is placed in the electromagnetic brake as shown in FIG. 1 and is exposed to the operational environment of the electromagnetic brake, which environment changes greatly during operation. As heat is generated from friction during the operation of the electromagnetic brake, the operational temperature of the electromagnetic brake increases, and so does the temperature of the search coil 14. As the temperature of the search coil 14 changes, the internal resistance 14a of the search coil 14 changes correspondingly. Because of the fluctuations, the electrical potential at that point P, which is led through the electromotive force measurement line 44 to the CPU 48, fluctuates accordingly and affects the value of the magnetic flux φ calculated by the CPU 48 with an error.

The effect of this electrical potential fluctuation varies correspondingly to the value A of the internal resistance 14a of the search coil 14 and the resistance B of the potential setup resistor 43, and the effect is smaller if resistance B is larger than resistance A. For example, these resistances are set as described in the above embodiment, i.e., A=100 Ω and B=1000 Ω, and suppose that the internal resistance 14a decreases to A=50 Ω because of a change in the temperature of the search coil 14. When the electromotive force induced in the search coil 14 is nil, i.e., e=0, if the internal resistance of the search coil 14 is A=100 Ω, then the voltage at that point P of the circuit shown in FIG. 6 is VP=2.31 V from the above equation (4). On the other hand, if the internal resistance decreases to A=50 Ω, the voltage at the point P will be as described in the following equation (5).

$$VP = (VH - VL) \times \{B/(A + B)\} + VL \quad (5)$$
$$= (2.5 - 0.5) \times (1000/1050) + 0.5$$
$$= 2.40$$

Even though the internal resistance 14a of the search coil 14 decreases greatly from 100 Ω to 50 Ω, the voltage VP at the point P changes a little from 2.31 V to 2.40 V. The effect of the fluctuation is minimized because the resistance B of the potential setup resistor 43 is set substantially larger than the resistance A, i.e., the internal resistance 14a of the search coil 14 (in the above example, it is ten times larger, or A=B/10). In this way, the fluctuation of the voltage VP is minimized against the fluctuation of the internal resistance of the search coil 14, which is caused by changes in the temperature.

Here, if the resistance B of the potential setup resistor 43 is set to B=100 Ω while the internal resistance 14a of the search coil 14 is kept at A=100 Ω (the search coil 14 is left as it is), i.e., A=B, then the voltage VP at the point P is calculated by the following equation (6).

$$VP = (VH - VL) \times \{B/(A + B)\} + VL \qquad (6)$$
$$= (2.5 - 0.5) \times (100/200) + 0.5$$
$$= 1.5$$

From this calculated value, it is clear that if the resistance B of the potential setup resistor 43 is not set sufficiently larger than the value A of the internal resistance 14a of the search coil 14, then the voltage VP at the point P will change greatly from 2.31 V to 1.5 V when the resistance value A of the internal resistance 14a decreases from 100 Ω to 50 Ω because of a change in the temperature of the search coil 14. In this example, fluctuations in the temperature of the search coil 14 affect the results of the detected magnetic flux φ with significant errors.

Figure 8:
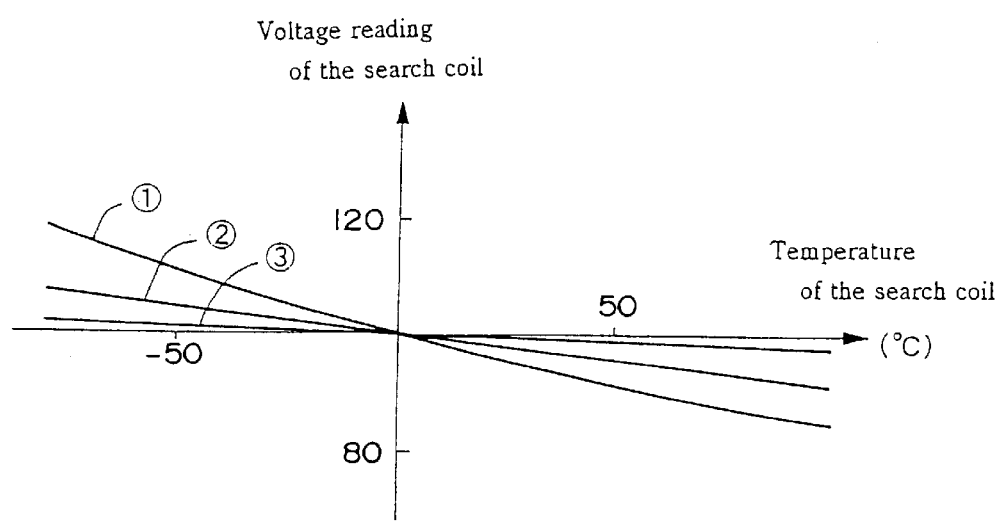
FIG. 8 is a graph showing relations between fluctuations in the temperature of the search coil and changes in the reading of electromotive force induced in the search coil.

From the above examples, it is clear that the error caused by fluctuations in the temperature of the search coil 14 is minimized by setting the resistance B of the potential setup resistor 43 sufficiently larger than the internal resistance A of the search coil 14. FIG. 8 shows relations between changes in the temperature of the search coil 14 and changes in the reading of the voltage VP at that point P in percentage, for three cases where the resistances are set to 1) A=B, 2) A=B/3, 3) A=B/30, respectively. As evidenced, the larger the resistance B of the potential setup resistor 43 than the internal resistance A, the smaller the rate of change of the voltage reading, which enables accurate magnetic flux detection. As long as these resistances are set within a range of A=B/3~A=B/30, practically, there will be no problem for achieving a magnetic flux detection at a desirable accuracy.

As described above, it is preferable that the resistance B of the potential setup resistor 43 be set sufficiently larger than the internal resistance A of the search coil 14. To achieve such a desirable setting, theoretically, either the internal resistance A is made smaller, or the potential setup resistance B is made larger. However, there is a limit to the minimization of the internal resistance A of the search coil 14 in cost effectiveness because it requires a coil material that has an even smaller electrical resistance, or it requires an enlargement of the diameter of the coil. In practice, the internal resistance of the search coil 14 is made as small as possible cost-effectively, and the resistance B of the potential setup resistor 43 is made sufficiently (for example, 3~30 times) larger than this internal resistance.

The magnetic flux calculator 40 of the magnetic flux detector constructed as shown in FIG. 6 can be integrated as a unit and be placed away from the search coil 14 and in an environment where there is little vibration and little temperature fluctuation. With this arrangement, the magnetic flux calculator 40 can be made waterproof easily. In addition, the two lines 35a and 35b connecting the search coil 14 and the magnetic flux calculator 40 are shielded as shielded cable 35 to protect the lines against electromagnetic interference.

Although the magnetic flux detector according to the present invention is applied to an electromagnetic brake as described in the above embodiment, its application is not limited to this example. The magnetic flux detector according to the present invention can be also applied to an electromagnetic clutch and to any type of device which uses an exciting coil to generate an electromagnetic force. Furthermore, in the magnetic flux calculator shown in FIG. 6, the electromotive force induced is offset to appear always as positive values in voltage. However, it may be offset to give always negative values.

As explained above, in a magnetic flux detector according to the present invention, the search coil is positioned in a magnetic path where a magnetic flux (so-called main magnetic flux) generated by a magnetic flux generator passes. As the electromotive force induced in the search coil corresponds directly to the change of the magnetic flux, the determination of the magnitude of the magnetic flux passing through the magnetic path is performed accurately by integrating the electromotive force for a time period. This arrangement effectively eliminates errors which may otherwise occur if the sensor is misaligned, for example, in a case of prior art where the sensor comprises a hall element to detect a leakage flux for determination of the magnitude of the magnetic flux. Also, the accuracy of the magnetic flux detector according to the present invention is immune to any flux leakage reduction, which can result from an improvement made in the efficiency of the magnetic circuit.

Furthermore, the magnetic flux detector according to the present invention has a potential setup resistor whose resistance is larger than the internal resistance of the search coil, at the inlet part of the magnetic flux calculator. With this arrangement, practically, the electromotive force induced in the search coil is not affected from fluctuations of the internal resistance of the search coil. In other words, because the effect of fluctuations in the internal resistance of the search coil on the electromotive force induced is minimized, the precision of the detector is maintained to perform an accurate magnetic flux detection even while the internal resistance of the search coil is changing in response to the fluctuation of the temperature.

The magnetic flux calculator of the magnetic flux detector according to the present invention may comprise a high potential setup circuit, which is connected to one end of the search coil and supplies a predetermined high electrical potential, a low potential setup circuit, which is connected through the potential setup resistor to the other end of the search coil and supplies a predetermined low electrical potential, and an electrical potential measuring device, which is connected to a predetermined point between the potential setup resistor and the latter end of the search coil and measures the electrical potential at this predetermined point. With this arrangement, the error in the measurement of the electromotive force induced in the search coil caused from fluctuations in the internal resistance of the search coil is minimized because the voltage measured at the predetermined point is affected only to a degree which corresponds to the ratio of the internal resistance of the search coil to the resistance of the potential setup resistor.

In the above arrangement, it is preferable that the high voltage, which is supplied by the high potential setup circuit, and the low voltage, which is supplied by the low potential setup circuit, be positive values. If these two voltages are positive, then the electrical potential measuring device measures only positive values. In this case, the measuring device can be simplified in construction.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

RELATED APPLICATIONS

This application claims the priority of Japanese Patent Application No.2001-104266 filed on Apr. 3, 2001, which is incorporated herein by reference.

What is claimed is:

1. A magnetic flux detector comprising:
   a magnetic flux generator, which generates a magnetic flux;
   a search coil, which is placed in a magnetic path where the magnetic flux generated by said magnetic flux generator passes, such that an electromotive force is induced in said search coil in response to a change in the magnetic flux; and
   a magnetic flux calculator, which determines the magnitude of the magnetic flux generated by said magnetic flux generator by measuring the electromotive force induced in said search coil, said magnetic flux calculator having an inlet for connection to said search coil;
   wherein:
      a potential setup resistor with a resistance larger than an internal resistance of said search coil is provided at the inlet of said magnetic flux calculator, and
      said magnetic flux generator comprises a ring-like core member having a horizontally laid U-shaped cross section, a ring-like exciting coil, which is provided in a groove of said core member defined by the horizontally laid U-shaped cross section, and a disk-like armature member, which is provided facing an opening side of the horizontally laid U-shaped cross section of said core member; and
   said search coil comprises a ring-like coil which is provided adjacent to said exciting coil in said groove of said core member.

2. The magnetic flux detector as set forth in claim 1, wherein:
   an excitation current is supplied to said exciting coil to generate a magnetic flux which passes through said core member and said armature member, generating an attraction force that attracts said armature member toward said core member; and
   said attraction force is controlled on a basis of the magnetic flux determined by said magnetic flux calculator.

3. The magnetic flux detector as set forth in claim 1 or 2, wherein said magnetic flux calculator comprises a high potential setup circuit, which is connected to one end of said search coil and supplies a predetermined high voltage, a low potential setup circuit, which is connected through said potential setup resistor to another end of said search coil and supplies a predetermined low voltage, and an electrical potential measuring device, which is connected to a predetermined point located between said potential setup resistor and said another end of said search coil and measures an electrical potential at said predetermined point.

4. The magnetic flux detector as set forth in claim 3, wherein said high voltage, which is supplied by said high potential setup circuit, and said low voltage, which is supplied by said low potential setup circuit, are both positive values.

5. A magnetic flux detector comprising:
   a magnetic flux generator, which generates a magnetic flux, said magnetic flux generator including a core member and an armature member forming a magnetic path;
   a search coil, which is placed in said magnetic path where the magnetic flux generated by said magnetic flux generator passes, such that an electromotive force is induced in said search coil in response to a change in the magnetic flux; and
   a magnetic flux calculator, which determines the magnitude of the magnetic flux generated by said magnetic flux generator by measuring the electromotive force induced in said search coil, said magnetic flux calculator having an inlet for connection to said search coil;
   wherein:
      a potential setup resistor with a resistance larger than an internal resistance of said search coil is provided at the inlet of said magnetic flux calculator;
      an excitation current is supplied to an exciting coil to generate said magnetic flux which passes through said core member and said armature member, generating an attraction force that attracts said armature member toward said core member; and
      said attraction force is controlled on a basis of the magnetic flux determined by said magnetic flux calculator.

6. The magnetic flux detector as set forth in claim 5, wherein said magnetic flux calculator comprises a high potential setup circuit, which is connected to one end of said search coil and supplies a predetermined high voltage, a low potential setup circuit, which is connected through said potential setup resistor to another end of said search coil and supplies a predetermined low voltage, and an electrical potential measuring device, which is connected to a predetermined point located between said potential setup resistor and said another end of said search coil and measures an electrical potential at said predetermined point.

7. The magnetic flux detector as set forth in claim 6, wherein said high voltage, which is supplied by said high potential setup circuit, and said low voltage, which is supplied by said low potential setup circuit, are both positive values.

* * * * *